(12) United States Patent
Chen et al.

(10) Patent No.: US 10,276,250 B1
(45) Date of Patent: Apr. 30, 2019

(54) PROGRAMMING NAND FLASH WITH IMPROVED ROBUSTNESS AGAINST DUMMY WL DISTURBANCE

(71) Applicant: MACRONIX INTERNATIONAL CO., LTD., Hsinchu (TW)

(72) Inventors: Wei-Chen Chen, Taoyuan (TW); Hang-Ting Lue, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/818,208

(22) Filed: Nov. 20, 2017

(51) Int. Cl.
G11C 16/04 (2006.01)
G11C 16/34 (2006.01)
G11C 16/24 (2006.01)
G11C 16/12 (2006.01)
H01L 27/11524 (2017.01)
H01L 27/1157 (2017.01)

(52) U.S. Cl.
CPC ...... G11C 16/3427 (2013.01); G11C 16/0483 (2013.01); G11C 16/12 (2013.01); G11C 16/24 (2013.01); H01L 27/1157 (2013.01); H01L 27/11524 (2013.01)

(58) Field of Classification Search
CPC .................................................. G11C 16/0483
USPC .................................................. 365/185.02
See application file for complete search history.

(56) References Cited

U.S. PATENT DOCUMENTS

| 8,289,774 | B2 | 10/2012 | Moon et al. |
| 8,385,115 | B2 | 2/2013 | Lee et al. |
| 8,842,479 | B2 | 9/2014 | Huang et al. |
| 9,171,627 | B2 | 10/2015 | Lee et al. |
| 9,564,223 | B2 | 2/2017 | Jung |
| 9,691,490 | B2 | 6/2017 | Choi et al. |
| 2010/0097862 | A1 | 4/2010 | Kang et al. |
| 2013/0279262 | A1* | 10/2013 | Yoon ............... G11C 16/10 365/185.18 |
| 2015/0179266 | A1* | 6/2015 | Park ............... G11C 16/10 365/185.2 |
| 2016/0099060 | A1* | 4/2016 | Yoo ............... G11C 16/10 365/185.11 |
| 2016/0217865 | A1 | 7/2016 | Chen et al. |
| 2017/0330631 | A1 | 11/2017 | Diep et al. |

OTHER PUBLICATIONS

EP Search Report from EP 17210682.5 dated Jul. 6, 2018, 8 pages.

* cited by examiner

Primary Examiner — Hoai V Ho
(74) Attorney, Agent, or Firm — Haynes Beffel & Wolfeld LLP

(57) ABSTRACT

A memory device includes a plurality of memory cells arranged in series in a semiconductor body. First and second dummy memory cells arranged in series between a first string select switch and a first edge memory cell at a first end of the plurality of memory cells. The first dummy memory cell is adjacent the first edge memory cell, and the second dummy memory cell is adjacent the first string select switch. A channel line includes channels for the plurality of memory cells and the first and second dummy memory cells. Control circuitry is adapted for programming a selected memory cell in the plurality of memory cells corresponding to a selected word line by applying a switching voltage to the first dummy memory cell, the switching voltage having a first voltage level during a first time interval, and thereafter changing to a second voltage level higher than the first voltage level.

16 Claims, 10 Drawing Sheets

Fig. 1: Pre-charge interval, one-step waveform for dummy word lines

Fig. 2: Pre-charge interval, two-step waveform for dummy word lines

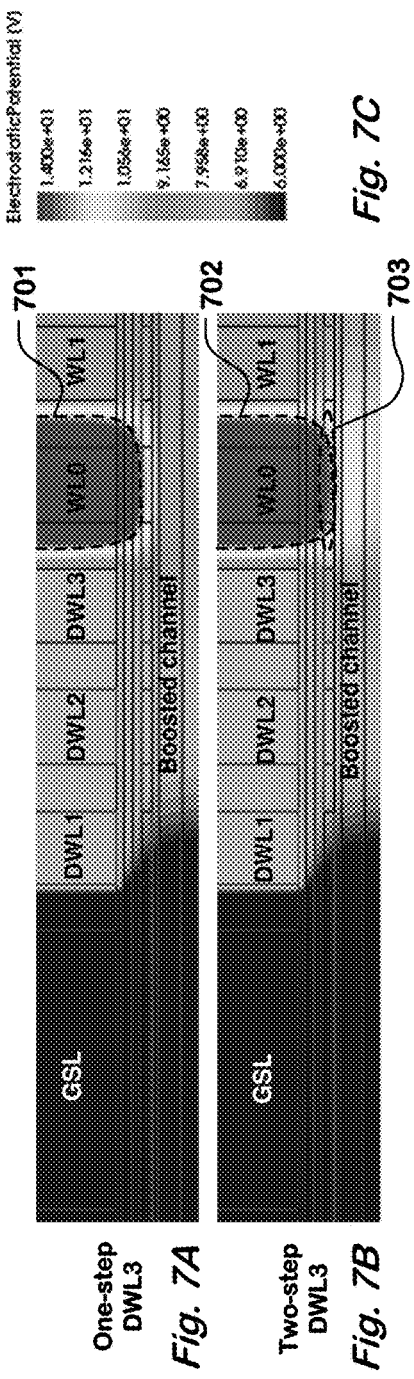
One-step DWL3
Fig. 7A
Two-step DWL3
Fig. 7B
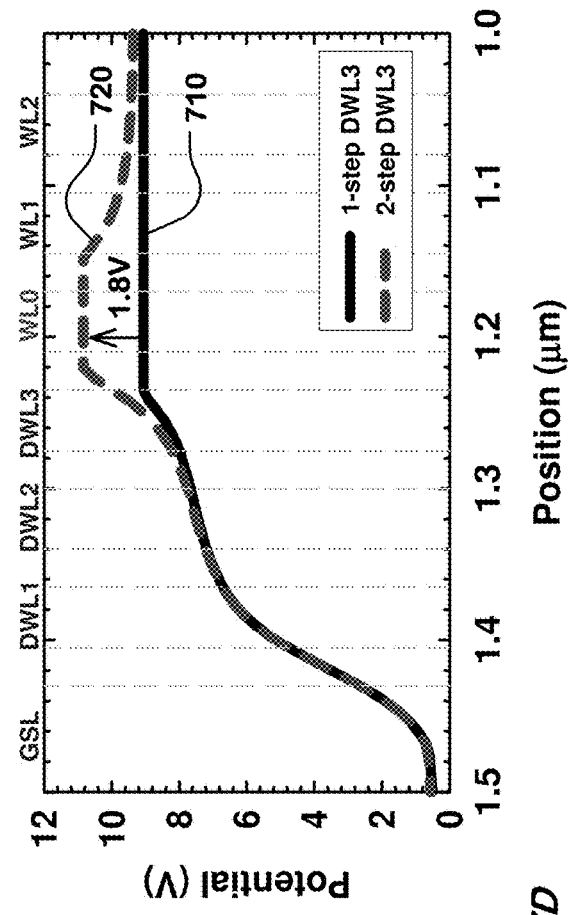
Fig. 7C
Fig. 7D

PROGRAMMING NAND FLASH WITH IMPROVED ROBUSTNESS AGAINST DUMMY WL DISTURBANCE

BACKGROUND

Field

The present technology relates to flash memory, and more particularly to programming flash memory in a NAND configuration.

Description of Related Art

For both conventional 2D and 3D NAND Flash, dummy word lines have been used in the NAND strings for a variety of purposes. As the dimensions and density of the arrays have progressed, additional dummy word lines have been incorporated to alleviate the undesirable programming disturbance on edge word lines. In cases without dummy word lines, the edge word lines for the NAND strings are more vulnerable to disturbance caused by Fowler-Nordheim (FN) tunneling or hot carrier effect since they are located in a place along a string of memory cells where the E-field can be high in some situations.

Nevertheless, now that multiple dummy word lines are located between GSL/SSL and the edge word lines, the dummy word lines become more likely to suffer hot carrier effects that can cause charge trapping in the dummy cells. However, as long as the threshold of the cells on dummy word lines does not approach the read pass voltage applied on unselected memory cells, such an effect does not pose an issue for flash operation. However, as the scaling of technology node continues and the need for multiple-bit per cell increases, the number of programming shots has increased drastically, which makes hot carrier effect and the associated disturbance almost inevitable for dummy word lines.

This issue is made even worse when considering that during a program operation on a selected NAND string, unselected NAND strings adjacent the selected NAND string undergo program inhibition. To ensure proper program inhibition of the unselected NAND strings, dummy word lines can be raised to a bias level that can cause the hot carrier effect for the dummy word lines in the selected string, where the dummy word lines are coupled to the selected NAND string and the unselected NAND strings.

It is desirable to provide a program method in which the disturbance of a dummy word line is mitigated and the program disturbance of an edge word line is reduced.

SUMMARY

A memory device comprises a plurality of memory cells arranged in series in a semiconductor body, such as can be applied for a NAND string in a NAND array. A first string select switch is arranged between a reference line and a first end of the plurality of memory cells, and a second string select switch is arranged between a bit line and a second end of the plurality of memory cells. First and second dummy memory cells are arranged in series between the first string select switch and a first edge memory cell at the first end, or between the second string select switch and a second edge memory cell at the second end. The first dummy memory cell is adjacent one of the first and second edge memory cells. The second dummy memory cell is adjacent one of the first and second string select switches.

Memory cells in the plurality of memory cells can be referred to as live memory cells. Live memory cells as used herein are addressable and utilized for data storage. Control circuitry coupled to live memory cells can write data to, read data from, and erase data in the live memory cells, via addresses supplied to the word line decoder and string select decoder (e.g. 1014, FIG. 10), and to the bit line decoder (e.g. 1018, FIG. 10).

Edge memory cells as used herein are live memory cells at a first end and a second end of a plurality of memory cells as applied for a NAND string. Edge memory cells in a NAND string can be more vulnerable to programming disturbance caused by Fowler-Nordheim (FN) tunneling than live memory cells between the edge memory cells in a NAND string.

Dummy memory cells as used herein are memory cells that are used to alleviate the undesirable programming disturbance on edge memory cells at a first end and a second end of a plurality of live memory cells as applied for a NAND string. Dummy memory cells are not addressable for purposes of data storage, and are not utilized to store data per se. Dummy memory cells are not live memory cells and vice versa.

The memory device comprises a channel line including channels for the memory cells in the plurality of memory cells and the first and second dummy memory cells. The memory device comprises a plurality of word lines, word lines in the plurality coupled to corresponding memory cells in the plurality of memory cells.

Control circuitry is coupled to the plurality of word lines and the first and second dummy memory cells. The control circuitry is adapted for programming a selected memory cell in the plurality of memory cells corresponding to a selected word line by applying a switching voltage to the first dummy memory cell. The switching voltage has a first voltage level during a first time interval, and thereafter changes to a second voltage level higher than the first voltage level during a second time interval. During a third time interval, a program voltage is applied to the selected word line, while the second voltage level is kept on the first dummy memory cell.

A two-step waveform applied to the first dummy memory cell as described herein, including the first voltage level during the first time interval lower than the second voltage level during the second time interval, can diminish the boosted potential of the first dummy memory cell during the first time interval, reduce the disturbance on the first dummy memory cell, and weaken the associated hot carrier effect.

The two-step waveform can also alleviate the erased state disturbance of an edge memory cell adjacent the first dummy memory cell, because the boosting efficiency of the edge memory cell is enhanced via the rise of the bias on the first dummy memory cell from the first voltage level (e.g. Vdwl-pre) to the second voltage level (e.g. Vdwl) in the second time interval. The boosting efficiency as used herein can be roughly expressed as the boosted channel potential of a specific word line divided by the applied bias to the specific word line.

During the first time interval, the bit line coupled to the channel line is pre-charged. When the bit line is pre-charged and a memory cell in the plurality of memory cells is at a high threshold voltage blocking a pre-charge current through the channel line, a transition of the switching voltage to the first voltage level during the first time interval can cause a boosted potential in a part of the channel line beneath the first dummy memory cell.

During the first time interval, a pass voltage level is applied to the second dummy memory cell. During the second and third time intervals, the pass voltage level is kept on the second dummy memory cell. The pass voltage level is high enough to turn on the channel at the second dummy memory cell during the first time interval to pre-charge the bit line coupled to the channel line.

During the first time interval, a blocking voltage lower than the first voltage level is applied to the selected word line, and to unselected word lines corresponding to unselected memory cells in the plurality of memory cells, where the blocking voltage can be lower than the first voltage level. During the second time interval, a pass voltage is applied to the unselected word lines and the selected word line, the pass voltage being lower than the program voltage. During the third time interval, the pass voltage is kept on the unselected word lines.

The memory device comprises a continuous charge trapping structure between the channel line and dummy word lines corresponding to the first and second dummy memory cells.

The memory device can comprise a third dummy memory cell arranged in series between the first and second dummy memory cells. The channel line includes a channel for the third dummy memory cell. The control circuitry can be coupled to the third dummy memory cell and further adapted for programming the selected memory cell by: during the first time interval, applying a pass voltage level to the third dummy memory cell; and during the second and third time intervals, keeping the pass voltage level on the third dummy memory cell.

A method is also described, for programming a selected memory cell in the plurality of memory cells corresponding to a selected word line, using a switching voltage to the first dummy memory cell, the switching voltage having a first voltage level during a first time interval, and thereafter changing to a second voltage level higher than the first voltage level.

Other aspects and advantages of the present technology can be seen on review of the drawings, the detailed description and the claims, which follow.

BRIEF DESCRIPTION OF THE DRAWINGS

FIGS. 7A and 7B are plots of the electrostatic potential for a string of live memory cells and dummy memory cells, during a program time interval, when a one-step waveform and a two-step waveform are used respectively, for a dummy memory cell adjacent an edge memory cell before the program time interval.

FIG. 7C is a legend showing color codes for the electrostatic potential shown in FIGS. 9A and 9B.

FIG. 7D is a diagram showing increased potential in the channel region of an edge memory cell during a program time interval.

DETAILED DESCRIPTION

The following description will typically be with reference to specific structural embodiments and methods. It is to be understood that there is no intention to limit the technology to the specifically disclosed embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows.

Figure 1:
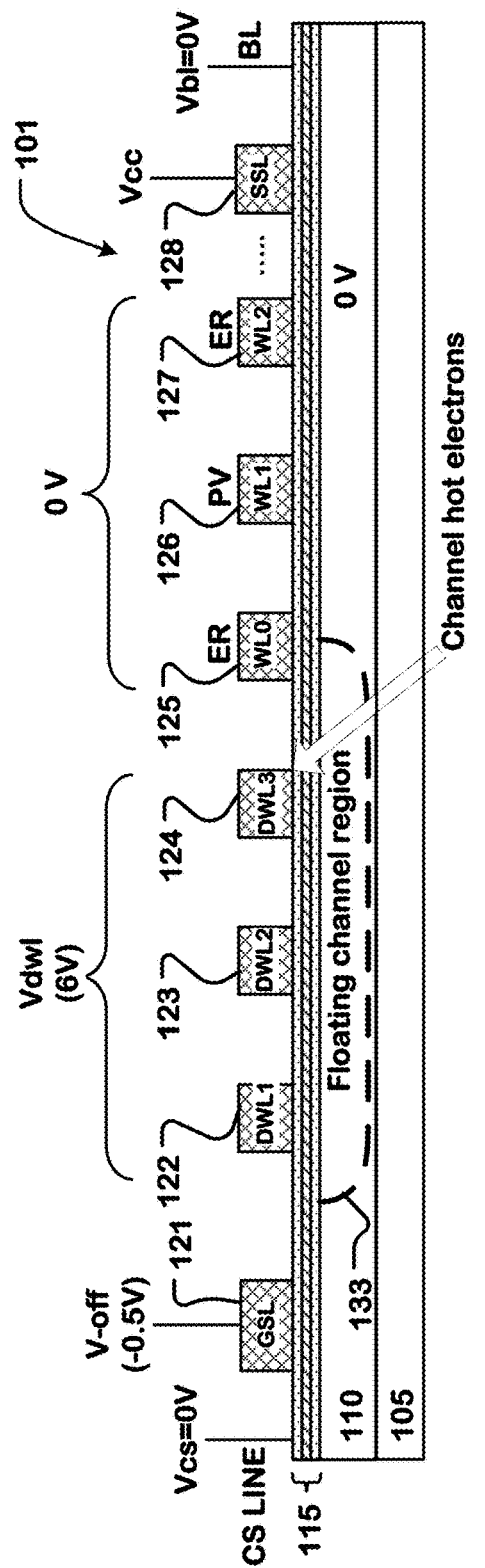
FIG. 1 is a simplified cross-sectional view of a NAND string biased during a bit line pre-charge time interval, according to a programming method using a one-step waveform for dummy word lines.

FIG. 1 is a simplified cross-sectional view of a memory device comprising a plurality of memory cells arranged in series in a semiconductor body (e.g. 105), such as can be applied for a NAND string (e.g. 101) in a NAND array. As shown in the example of FIG. 1, the NAND string is biased during a bit line pre-charge time interval, according to a programming method using a one-step waveform for dummy word lines. Memory cells in the plurality of memory cells (e.g. 125, 126 and 127) are live memory cells that are addressable and utilized for data storage. Control circuitry coupled to live memory cells can write data to, read data from, and erase data in the live memory cells, via addresses supplied to the word line decoder and string select decoder (e.g. 1014, FIG. 10), and to the bit line decoder (e.g. 1018, FIG. 10).

A first string select switch (e.g. 121) is arranged between a reference line (e.g. CSL) and a first end of the plurality of memory cells, and a second string select switch (e.g. 129) is arranged between a bit line (e.g. BL) and a second end of the plurality of memory cells. The first string select switch (e.g. 121) and the second string select switch (e.g. 129) correspond to ground select line GSL and string select line SSL, respectively.

As shown in FIG. 1, first and second dummy memory cells (e.g. 124, 122) are arranged in series between the first string select switch (e.g. 121) and a first edge memory cell (e.g. 125) at the first end of the plurality of memory cells, where the first dummy memory cell (e.g. 124) is adjacent the first edge memory cell (e.g. 125), and the second dummy memory cell (e.g. 122) is adjacent the first string select switch (e.g. 121). The memory device can include a third dummy memory cell (e.g. 123) arranged in series between the first and second dummy memory cells (e.g. 124 and 122). The first, second and third dummy memory cells correspond to dummy word lines DWL3, DWL1 and DWL2, respectively.

The memory device comprises a channel line (e.g. 110) including channels for the memory cells in the plurality of memory cells, and the first, second and third dummy memory cells.

The memory device includes a plurality of word lines. Word lines in the plurality of word lines (e.g. WL0, WL1, WL2) are coupled to corresponding memory cells in the plurality of memory cells (e.g. 125, 126, 127). Dummy memory cells and live memory cells in the plurality of memory cells are arranged in a NAND string extending in a direction orthogonal to word lines. Dummy word lines (e.g. DWL1, DWL2, DWL3) and word lines (e.g. WL0, WL1, WL2) corresponding to the dummy memory cells and the live memory cells can extend across a number of parallel NAND strings.

As shown in FIG. 1, three live memory cells (e.g. 125, 126 and 127) are arranged in series in the NAND string for simplicity. In typical implementations, a NAND string may comprise 16, 32 or more live memory cells arranged in series, not counting any dummy memory cells that may be arranged in series in the NAND string. The memory device includes a continuous charge trapping structure (e.g. 115) between the channel line (e.g. 110) and dummy word lines (e.g. DWL1, DWL2, DWL3) corresponding to the first, second and third dummy memory cells (e.g. 122, 123, 124). The charge trapping structure 115 in the memory cells can be dielectric charge trapping structures, floating gate charge trapping structures, or other flash memory structures suitable for programming using techniques described herein.

FIG. 1 shows the biasing on dummy memory cells during a bit line pre-charge time interval using a one-step waveform for dummy word lines. According to the biasing illustrated, the GSL is biased to about zero volts while the common source line is grounded (V-CSL=0V), so that the first string select switch 121 corresponding to the GSL line is off, and the SSL is biased to about $V_{CC}$ while the bit line is grounded (Vbl=0V), so that the second string select switch 128 corresponding to the SSL line is on. The dummy memory cells are biased at a voltage Vdwl (e.g. 6V), while the live memory cells are biased at a voltage equal to or near ground (e.g. 0V).

As shown in FIG. 1, a live memory cell 126 corresponding to a word line WL1 is at a programmed state (PV) and live memory cells 125 and 127 corresponding to word lines WL0 and WL2 are at an erased state (ER). Throughout a programming sequence, live memory cells WL0 and WL2 are intended to be left in the erased state, and tend to have a lower threshold voltage than a live memory cell (e.g. 126) at a programmed state. Because of the programmed state of the live memory cell 126 with a higher threshold voltage, the bit line bias (e.g. 0V) cannot be passed into the channel regions of dummy word lines DWL1, DWL2 and DWL3. In other words, pre-charging is hindered in the channel region of WL1 because of the lower conductivity in the channel region due to the higher threshold voltage. Consequently the channel region (e.g. 133) from DWL1 to WL0 is floating, and the self-boosted potential in the channel region 133 is determined by the bias applied on the dummy word lines, including the first dummy word line (e.g. DWL3).

Figure 5:
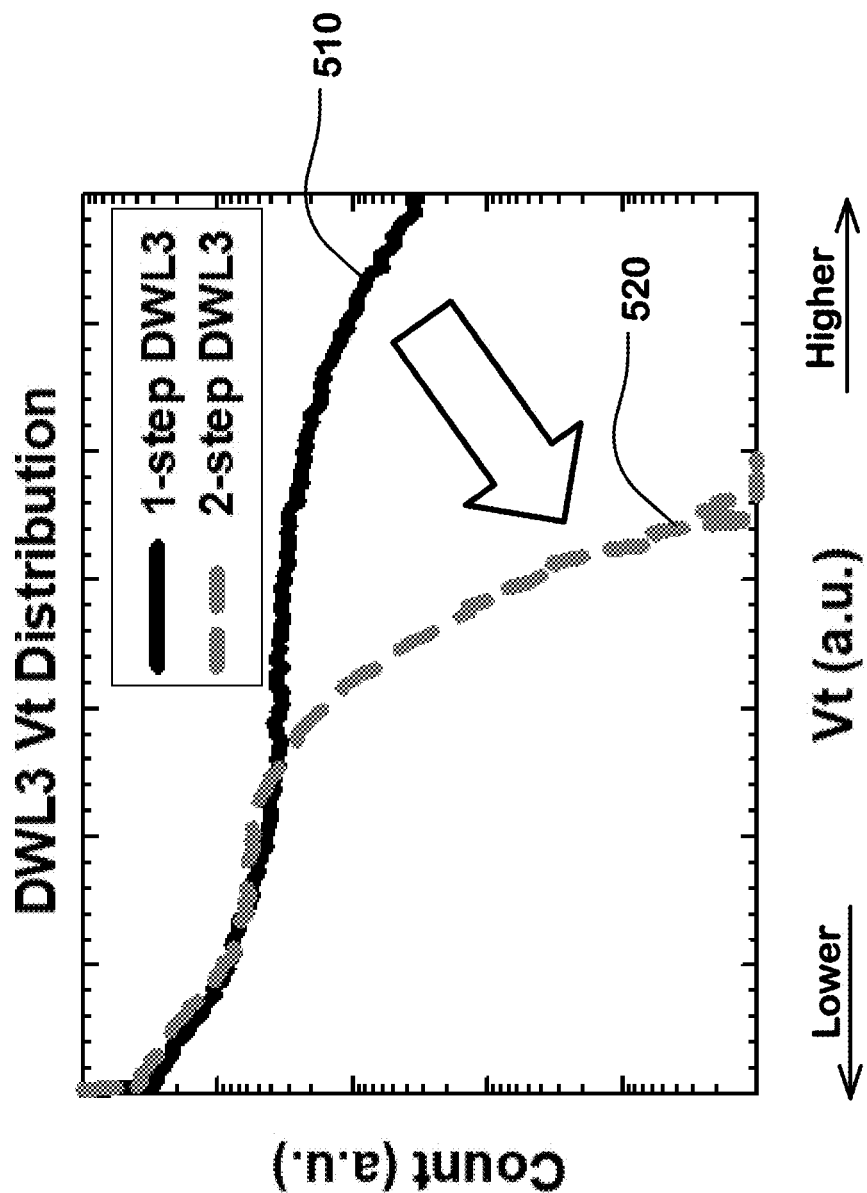
FIG. 5 is a diagram showing improvement on relieving disturbance of dummy word lines according to the present technology.
Figure 6:
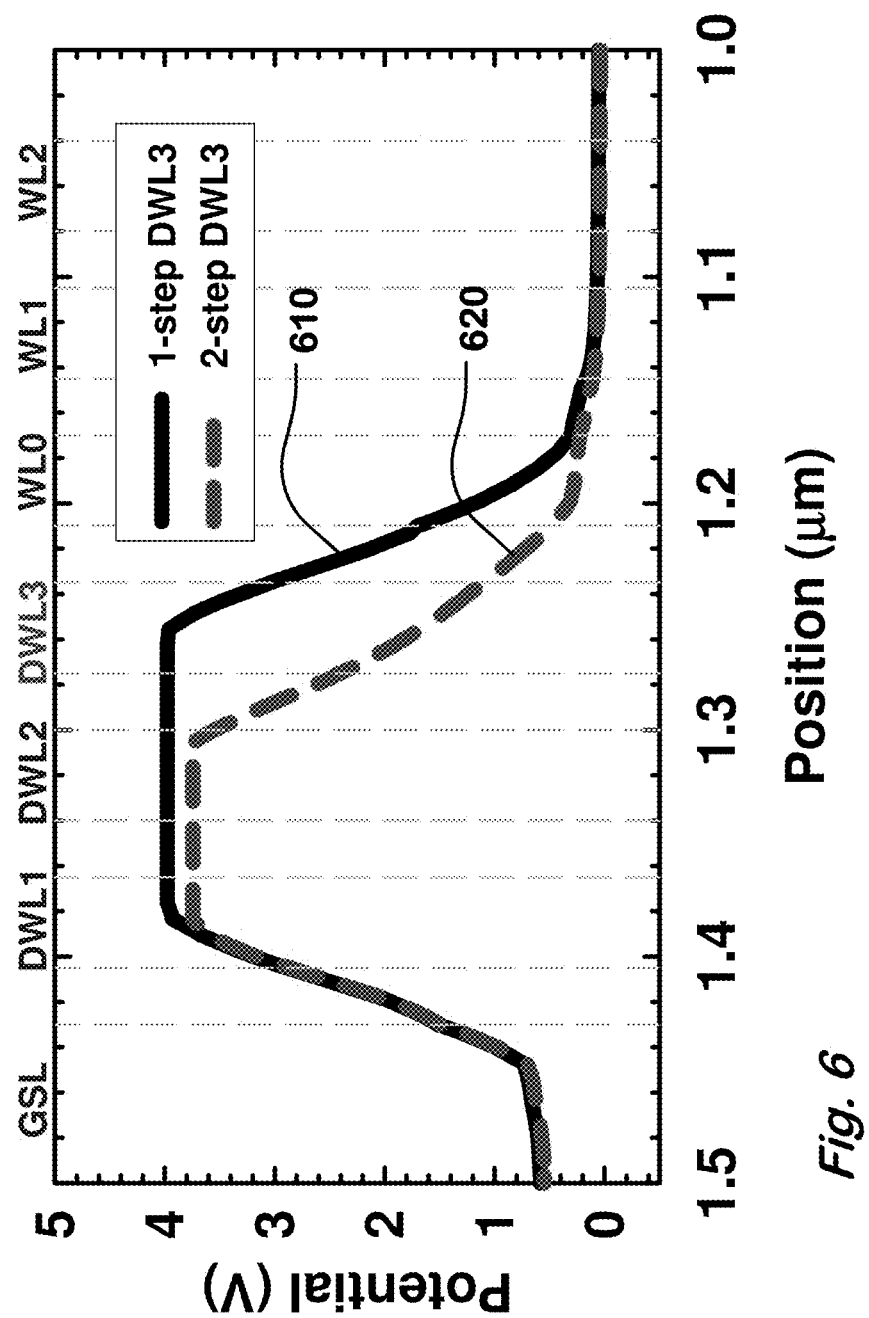
FIG. 6 is a diagram showing reduced boosted potential in the channel region of a dummy memory cell adjacent an edge memory cell during a first time interval to pre-charge a bit line coupled to a channel line.

The channel region under the first dummy word line DWL3 is more susceptible to channel hot electrons than channel regions under other dummy word lines, as further described in reference to FIG. 6. Disturbance associated with the channel hot electrons on the first dummy memory cell (e.g. 124) corresponding to the first dummy word line DWL3 is further described in reference to FIG. 5.

Figure 2:
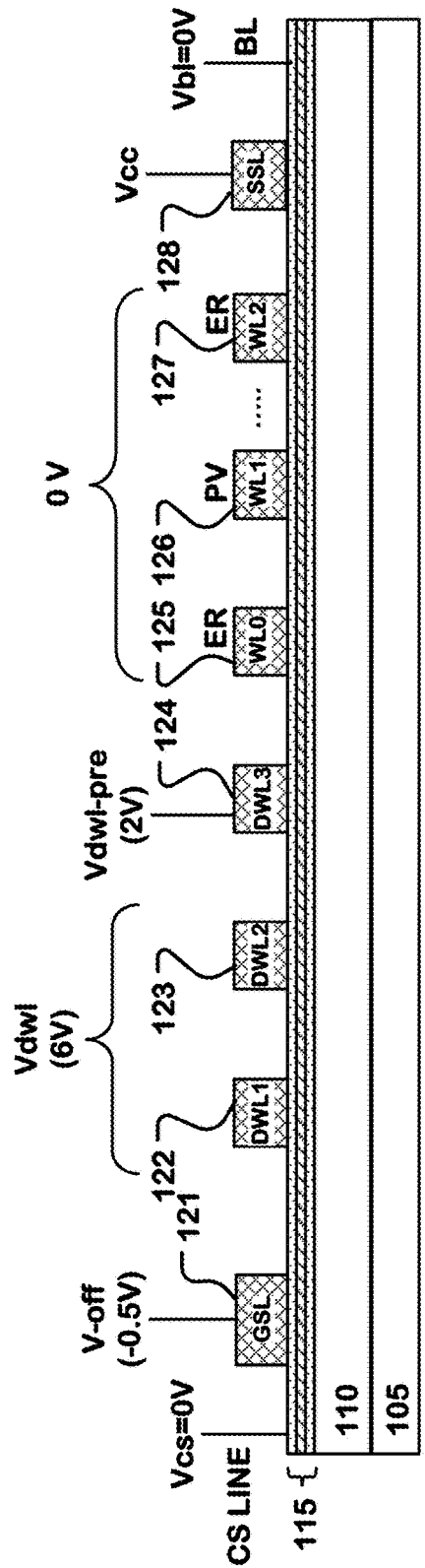
FIG. 2 is a simplified cross-sectional view of a NAND string biased during a bit line pre-charge time interval, according to a programming method using a two-step waveform for dummy word lines.

FIG. 2 is a simplified cross-sectional view of a NAND string biased during a bit line pre-charge time interval, according to a programming method using a two-step waveform for dummy word lines. Description about the structure of a NAND string in FIG. 1 is applicable to FIG. 2, and is not repeated here.

FIG. 2 shows the biasing on dummy memory cells during a bit line pre-charge time interval using a two-step waveform for dummy word lines. According to the biasing illustrated, as in FIG. 1, the GSL is biased to about zero volts while the common source line is grounded (V-CSL=0V), so that the first string select switch 121 corresponding to the GSL line is off, and the SSL is biased to about $V_{CC}$ while the bit line is grounded (Vbl=0V), so that the second string select switch 128 corresponding to the SSL line is on. Also as in FIG. 1, the live memory cells (e.g. 125-127) are biased at a voltage equal to or near ground (e.g. 0V).

In FIG. 2, according to a two-step waveform for dummy word lines, the first dummy memory cell (e.g. 124) adjacent the first edge memory cell (e.g. 125) is applied a switching voltage. The switching voltage has a first voltage level (e.g. Vdwl-pre) during a first time interval (e.g. a bit line pre-charge time interval, FIG. 4), and thereafter changes to a second voltage level (e.g. Vdwl) higher than the first voltage level during a second time interval (e.g. a word line setup interval, FIG. 4). For instance, Vdwl-pre and Vdwl can be 2V and 6V, respectively. In one embodiment, a time-varying power source can provide a switching voltage for the first dummy word line (e.g. DWL3) coupled to the first dummy memory cell, where the switching voltage has a first voltage level (e.g. Vdwl-pre) during a first time interval and a second voltage level (e.g. Vdwl) higher than the first voltage level during a second time interval as described herein. In an alternative embodiment, a first power source can provide a first voltage level (e.g. Vdwl-pre) of the switching voltage during a first time interval for the first dummy word line (e.g. DWL3) coupled to the first dummy memory cell, and a second power source can provide a second voltage level (e.g. Vdwl) of the switching voltage higher than the first voltage level during a second time interval for the first dummy word line (e.g. DWL3) coupled to the first dummy memory cell.

A two-step waveform applied to the first dummy memory cell, including the first voltage level during the first time interval lower than the second voltage level during the second time interval, can diminish the boosted potential of the first dummy memory cell (e.g. 124) adjacent the first edge memory cell (e.g. 125) during the first time interval, reduce the disturbance on the first dummy memory cell, and weaken the associated hot carrier effect, as further described in reference to FIG. 6.

The threshold voltages of dummy memory cells adjacent edge memory cells can be lowered with the programming method using a two-step waveform for dummy word lines. Consequently the chance of the threshold voltages of dummy memory cells adjacent edge memory cells being too high to allow proper read operation is minimized, as further described in reference to FIG. 5. 3D NAND Flash generally requires more program shots to attain MLC (multiple-level cell) or TLC (triple-level cell) functionality, and the associated hot carrier effect is more serious than with 2D NAND Flash. Although more dummy word lines (e.g. 3 dummy word lines) can be used to counter the hot carrier effect in 3D NAND Flash, fewer dummy word lines (e.g. 1 or 2 dummy word lines) can be used if the hot carrier effect can be reduced for example using the technology described herein.

Figure 3:
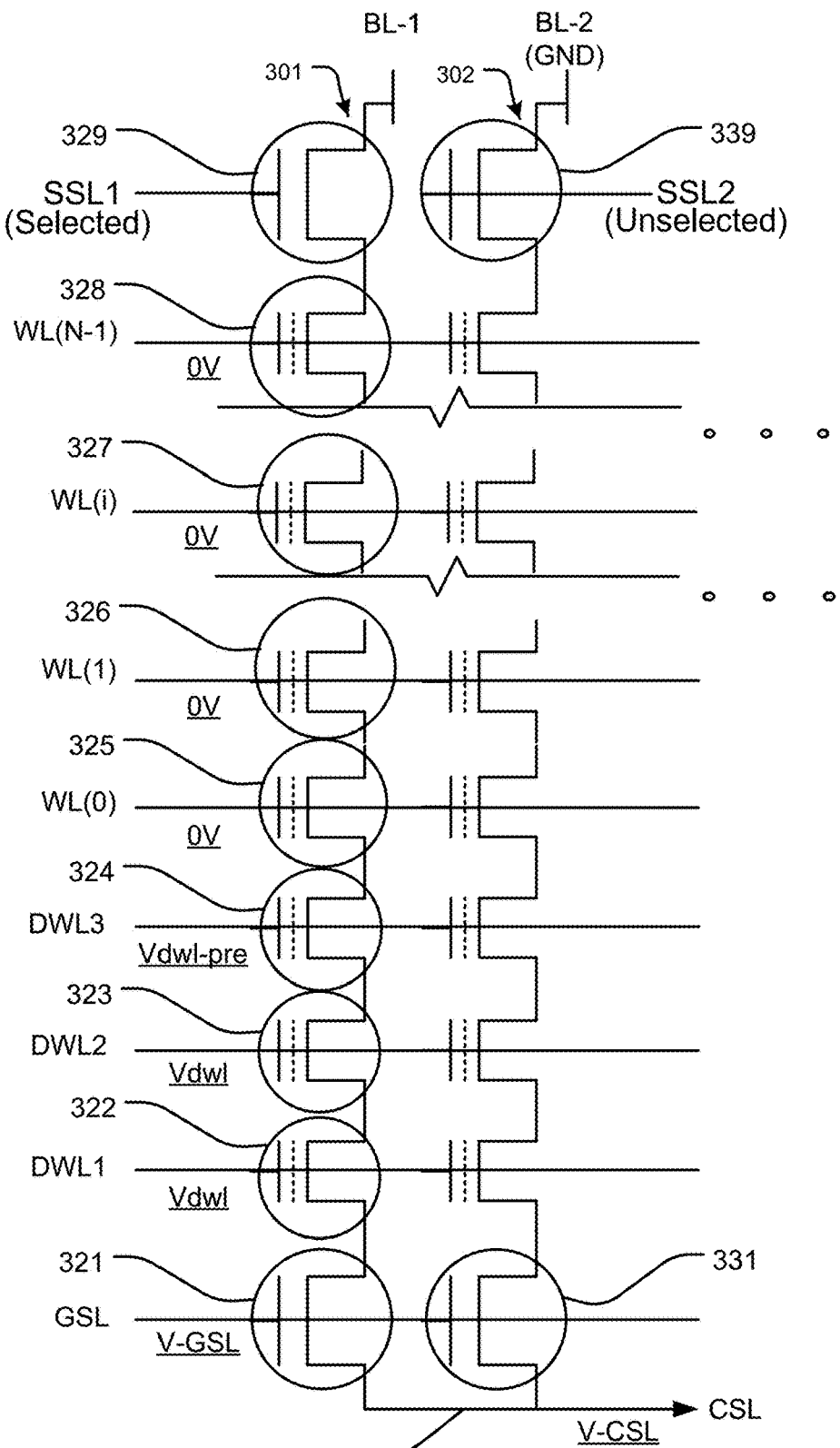
FIG. 3 is a circuit diagram showing partial layout of an example memory device comprising a plurality of memory cells arranged in series in a semiconductor body.

FIG. 3 is a circuit diagram showing partial layout of an example memory device comprising a plurality of memory cells arranged in series in a semiconductor body, such as can be applied for a NAND string (e.g. 301, 302) in a NAND array. NAND strings 301 and 302 are coupled to respective bit lines BL-1 to BL-2 and to a reference line (e.g. 340). A first string select switch (e.g. 321) is arranged between the reference line (e.g. 340) and a first end of the plurality of memory cells, and a second string select switch (e.g. 329) is arranged between a bit line (e.g. BL-1) and a second end of the plurality of memory cells. For a NAND string 301, a first string select switch (e.g. 321) and a second string select switch (e.g. 329) correspond to a ground select line GSL and a string select line SSL1, respectively. For a NAND string 302, a first string select switch (e.g. 331) and a second string select switch (e.g. 339) correspond to ground select line GSL and a string select line SSL2, respectively. The reference line (e.g. 340) is common to NAND strings 301 and 302. String select lines SSL1 and SSL2 corresponding to second string select switches 329 and 339 can be biased at different voltages, for example to select the NAND string 301 and unselect the NAND string 302.

First and second dummy memory cells (e.g. 324, 322) arranged in series between the first string select switch (e.g. 321) and a first edge memory cell (e.g. 325) at the first end of the plurality of memory cells, where the first dummy memory cell (e.g. 324) is adjacent the first edge memory cell (e.g. 325), and the second dummy memory cell (e.g. DWL1) is adjacent the first string select switch (e.g. 321). The memory device can include a third dummy memory cell (e.g. 322) arranged in series between the first and second dummy memory cells (e.g. 324 and 322). The first, second and third dummy memory cells correspond to dummy word lines DWL3, DWL1 and DWL2, respectively.

The memory device includes a plurality of word lines including N word lines. Word lines in the plurality of word lines (e.g. WL(0), WL(1), . . . , WL(i), . . . , WL(N−1)) are coupled to corresponding memory cells in the plurality of memory cells (e.g. 325-328).

For the purpose of illustration, the bias voltages are shown for programming a selected memory cell (e.g. 325) on corresponding word line WL(0) in the NAND string 301, during a first time interval to pre-charge a bit line coupled to a channel line of a selected NAND string (e.g. 301) via the bit line BL-1. A switching voltage is applied to the first dummy memory cell (e.g. DWL3), the switching voltage having a first voltage level (e.g. Vdwl-pre) during the first time interval, and thereafter changing to a second voltage level (e.g. Vdwl) higher than the first voltage level during the second time interval. Live memory cells in the string 301 (e.g. 325, 326, 327, 328) on corresponding word lines (e.g. WL(0), WL(1), . . . , WL(i), . . . , WL(N−1)) receive a voltage level equal to or near ground (e.g. 0V), during the first time interval to pre-charge the bit line coupled to the channel line of the NAND string 301.

The string select line SSL1 in the NAND string 301 is biased to turn on the string select switch 329 during the first time interval, keep the string select switch 329 turned-on through the first, second and third time intervals, and turn off the string select switch 329 after the third time interval. The string select line SSL2 in the NAND string 302 is biased to turn on the string select switch 339 during the first time interval, and turn off the string select switch 329 at least through the second and third time intervals to unselect the NAND string 302.

The ground select line GSL coupled to both the NAND strings 301 and 302 is biased by a ground select line voltage such as V-GSL to turn on the ground select switches 321 and 331 during the first time interval, and turn off the ground select switches 321 and 331 at least through the second and third time intervals.

Figure 4:
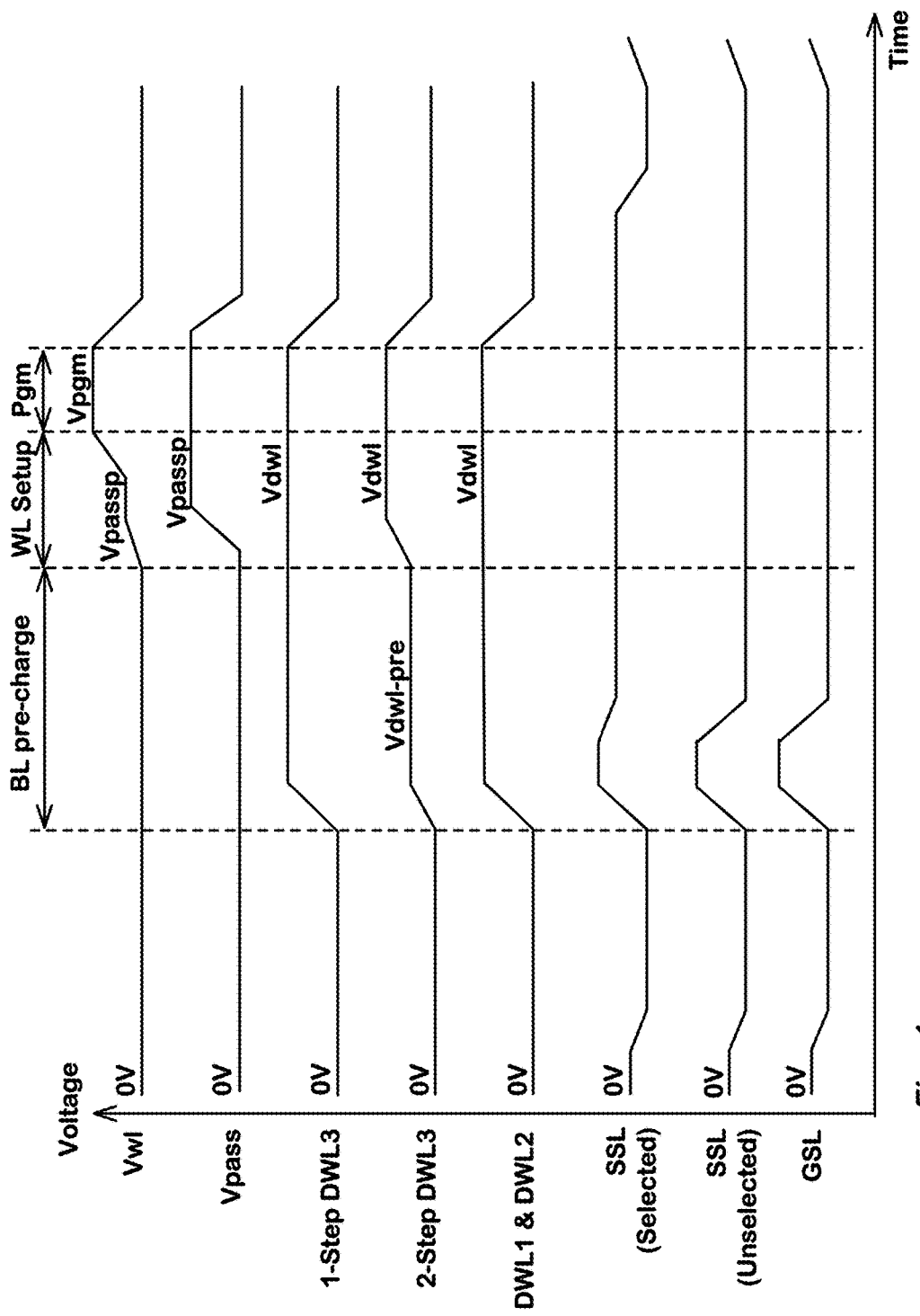
FIG. 4 is a timing diagram for one example of the bias voltages in connection with a program operation described with reference to FIG. 3.

FIG. 4 is a timing diagram for one example of the bias voltages in connection with a program operation described with reference to FIG. 3. FIG. 4 illustrates a first time interval (e.g. bit line pre-charge time interval), a second time interval (e.g. word line setup time interval), and a third time interval (e.g. program time interval). Unselected bit lines (e.g. BL-2) are biased at ground throughout the first, second and third time intervals of the program operation. Before the first time interval, a selected word line (e.g. WL(0), FIG. 3), unselected word lines (e.g. WL(0), WL(1), WL(i), WL(N−1)), and dummy word lines (e.g. DWL1, DWL2, DWL3) are biased at about 0V.

A switching voltage is applied to the first dummy memory cell (e.g. DWL3), the switching voltage having a first voltage level (e.g. Vdwl-pre) during the first time interval, and thereafter changing to a second voltage level (e.g. Vdwl) higher than the first voltage level during the second time interval. During the third time interval, a program voltage (e.g. Vpgm) is applied to the selected word line (e.g. WL(0)), while the second voltage level is kept on the first dummy memory cell.

During the first time interval (e.g. bit line pre-charge time interval), the bit line coupled to the channel line is pre-charged. When the bit line is pre-charged and a memory cell in the plurality of memory cells is at a high threshold voltage blocking a pre-charge current through the channel line, a transition of the switching voltage to the first voltage level during the first time interval can cause a boosted potential in a part of the channel line beneath the first dummy memory cell.

During the first time interval, a pass voltage level is applied to the second and third dummy memory cells (e.g. DWL1, DWL2). The pass voltage level is high enough to turn on the channel at the second and third dummy memory cells during the first time interval to pre-charge the bit line coupled to the channel line. The pass voltage level can be at a same voltage level as the second voltage level (e.g. Vdwl). During the second and third time intervals, the pass voltage level is kept on the second and third dummy memory cells.

During the first time interval, a blocking voltage (e.g. 0V) is applied to the selected word line corresponding to the selected memory cell, and to unselected word lines corresponding to unselected memory cells in the plurality of memory cells, where the blocking voltage can be lower than the first voltage level. During the second time interval, a pass voltage (e.g. Vpassp) is applied to the unselected word lines and the selected word line, where the pass voltage is lower than the program voltage. During the second and third time intervals, the pass voltage level is kept on the second and third dummy memory cells. During the third time interval, the pass voltage (e.g. Vpassp) is kept on the unselected word lines.

In an embodiment, the first voltage level (e.g. Vdwl-pre) and the second voltage level (e.g. Vdwl) of the switching voltage applied to the first dummy memory cell can be 2V and 6V respectively. The program voltage (e.g. Vpgm) applied to the selected word line can be 20V, and the pass voltage (e.g. Vpassp) can be 10V.

A string select line SSL (e.g. SSL1, FIG. 3) in a selected NAND string (e.g. 301, FIG. 3) is biased to turn on a string select switch (e.g. 329, FIG. 3) coupled to the string select line during the first time interval, keep the string select switch turned-on through the first, second and third time intervals, and turn off the string select switch after the third time interval.

A string select line SSL (e.g. SSL2, FIG. 3) in an unselected NAND string (e.g. 302, FIG. 3) is biased to turn on a string select switch (e.g. 339, FIG. 3) coupled to the string select line during the first time interval, and turn off the string select switch in the unselected NAND string at least through the second and third time intervals.

A ground select line GSL coupled to both a selected and an unselected NAND strings is biased to turn on the ground select switches (e.g. 321, 331, FIG. 3) in both the selected and unselected NAND strings (e.g. 301, 302, FIG. 3) during the first time interval, and turn off the ground select switches in both the selected and unselected NAND strings at least through the second and third time intervals.

FIG. 5 is a diagram showing reduced threshold voltage of dummy memory cells adjacent edge memory cells in atomic units (a.u.) according to the present technology. A curve 510 is shown for threshold voltages of dummy memory cells adjacent edge memory cells resultant from a programming method using a one-step waveform for dummy word lines. A curve 520 is shown for threshold voltages of dummy memory cells adjacent edge memory cells resultant from a programming method using a two-step waveform for dummy word lines. The disturbance on dummy memory cells (e.g. DWL3, FIGS. 2-3) adjacent edge memory cells (e.g. WL0, FIGS. 2-3) is reduced with the programming method using a two-step waveform for dummy word lines. The threshold voltages of dummy memory cells adjacent edge memory cells are lowered with the programming method using a two-step waveform for dummy word lines. Consequently the chance of the threshold voltages of dummy memory cells adjacent edge memory cells being too high to allow proper read operation is minimized.

FIG. 6 is a diagram showing reduced boosted potential in the channel region of a dummy memory cell adjacent an edge memory cell during a bit line pre-charge time interval. Curves 610 and 620 are shown for boosted potential in the channel region of a dummy memory cell (e.g. DWL3) adjacent an edge memory cell (e.g. WL0) vs position, during a bit line pre-charge time interval. Curves 610 and 620 are based on TCAD simulation of programming methods using a one-step waveform and a two-step waveform respectively for DWL3. Potential shown in the diagram is relative to a common source line (e.g. 340, FIG. 3), which can be at 0V for example.

In one example, a live memory cell corresponding to a word line WL1 is at a programmed state (PV) and live memory cells corresponding to word lines WL0 and WL2 are at an erased state (ER). Throughout a programming sequence, live memory cells corresponding to word lines WL0 and WL2 are intended to be left in the erased state, and tend to have a lower threshold voltage than a live memory cell corresponding to a word line WL1 at a programmed state. Because of the programmed state of WL1 with a higher threshold voltage, the bit line bias (e.g. 0V) cannot be passed into the channel regions of dummy word lines DWL1, DWL2 and DWL3. In other words, pre-charging is hindered in the channel region of WL1 because of the lower conductivity in the channel region due to the higher threshold voltage. Consequently the channel region from DWL1 to WL0 is floating, and the self-boosted potential is determined by a bias applied on dummy word lines DWL1, DWL2 and DWL3.

Curve 610 shows that the largest lateral E-field is situated in the DWL3 area, making it more susceptible to hot carrier effect, when a one-step waveform for the dummy word line DWL3 is used. Curve 620 shows that, when a two-step waveform for the dummy word line DWL3 is used, the bias on the dummy word line DWL3 is lower in the bit line pre-charge time interval, reducing the boosted potential in the channel region of DWL3 and helping relieve the associated hot carrier effect.

FIGS. 7A and 7B are plots of the electrostatic potential for a NAND string of live memory cells and dummy memory cells, during a program time interval, when a one-step waveform and a two-step waveform are applied respectively to a dummy memory cell (e.g. DWL3) adjacent an edge memory cell (e.g. WL0) before the program time interval.

In FIG. 7A, when an electrical bias is applied to an edge memory cell WL0, an electrostatic potential region 701 penetrates into the channel region of the edge memory cell WL0. In the case shown in FIG. 7A, a one-step waveform is used for an adjacent dummy memory cell DWL3 before the program time interval. In FIG. 7B, when an electrical bias is applied to an edge memory cell WL0, an electrostatic potential region 702 penetrates deeper (e.g. 703, FIG. 7B) into the channel region of the edge memory cell WL0. In the case shown in FIG. 7B, a two-step waveform is used for an adjacent dummy memory cell DWL3 before the program time interval. The deeper penetration of the electrostatic potential into the channel region can result in a potential difference (e.g. 1.8V) for the edge memory cell WL0 during a program time interval, as described in connection to FIG. 7D.

FIG. 7C is a legend showing color codes for the electrostatic potential shown in FIGS. 7A and 7B. The term "electrostatic potential" is the mathematical solution obtained by solving the fundamental Poisson equation in a device simulator. The legend includes color codes for electrostatic potential between 6.000e+00 V and 1.400e+01 V.

FIG. 7D is a diagram showing increased channel potential of a first edge memory cell (e.g. WL0) during a program time interval. Curves 710 and 720 are shown for channel potential of a first edge memory cell (e.g. WL0) adjacent a dummy memory cell (e.g. DWL3) vs position, during a program time interval. Curves 710 and 720 are based on TCAD simulation of programming methods using a one-step waveform and a two-step waveform respectively for a dummy memory cell DWL3.

When the two-step waveform is used for DWL3, DWL3 bias is raised from Vdwl-pre to Vdwl during the word line setup time interval, and thus the channel potential of DWL3 can be further increased via self-boosting. Since the first edge memory cell WL0 is adjacent the first dummy memory cell DWL3 and the channel potential is continuous through the channel regions of DWL3 and WL0, higher channel potential of the dummy memory cell DWL3 is also beneficial for enhancing the channel potential of the first edge memory cell WL0.

Curves 710 and 720 indicate that when the two-step waveform is used for DWL3 during the bit line pre-charge time interval and the word line setup time interval, the boosted potential of the first edge memory cell WL0 can be improved by 1.8V over the one-step counterpart as indicated by curve 710, which is advantageous for mitigating program disturbance on the first edge memory cell WL0.

For instance, for TCAD simulation corresponding to FIG. 7D, during the program time interval, the electrical bias applied to the dummy word lines DWL1, DWL2 and DWL3 can be 8V, the program voltage applied to a selected memory cell (e.g. WL0) can be 20V, and the pass voltage applied to unselected live memory cells (e.g. WL1, WL2) can be 10V.

For a P+ word line material, which is the default assumption for the simulation, the electrical bias applied to the selected memory cell WL0 is the electrostatic potential+0.56V, where 0.56V is half of Si band-gap. The electrostatic potential region (902, FIG. 7B) penetrates deeper (903, FIG. 7B) into the channel region of WL0 when the two-step waveform is used for DWL3. As a result, the channel potential of WL0 can be elevated to a greater extent. An improvement of 1.8V potential difference for example over the one-step waveform for DWL3 can translate to noticeable threshold voltage shift (e.g. FIG. 8), mitigating program disturbance.

Figure 8:
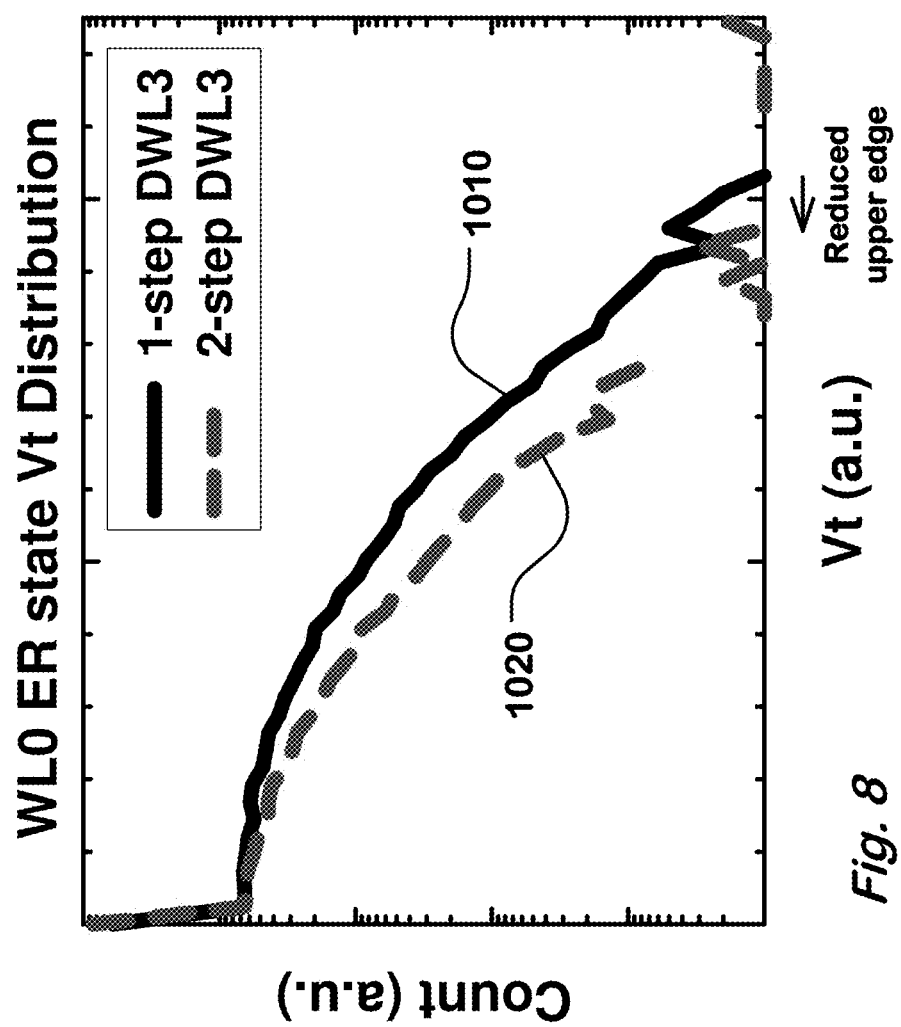
FIG. 8 is a diagram showing mitigated threshold voltage disturbance in the erased state for edge memory cells.

FIG. 8 is a diagram showing mitigated threshold voltage disturbance in the erased state for edge memory cells. Curves 810 and 820 are shown for threshold voltage distributions in the erased state for edge memory cells (e.g. WL0) adjacent a dummy memory cell (e.g. DWL3), when a one-step waveform and a two-step waveform are used respectively for the dummy memory cell DWL3. Curves 710 and 720 are based on experimental data.

When a two-step waveform is used for a dummy memory cell (e.g. DWL3) adjacent the edge memory cell (e.g. WL0), the channel potential beneath WL0 can be higher by 1.8V (FIG. 7D) than when the one-step waveform is used. Thus, the edge memory cell WL0 is less susceptible to program disturbance, and an upper edge of the erased state threshold voltage distribution for an edge memory cell (e.g. WL0) can be reduced, as compared to when the one-step waveform is used.

Figure 9:
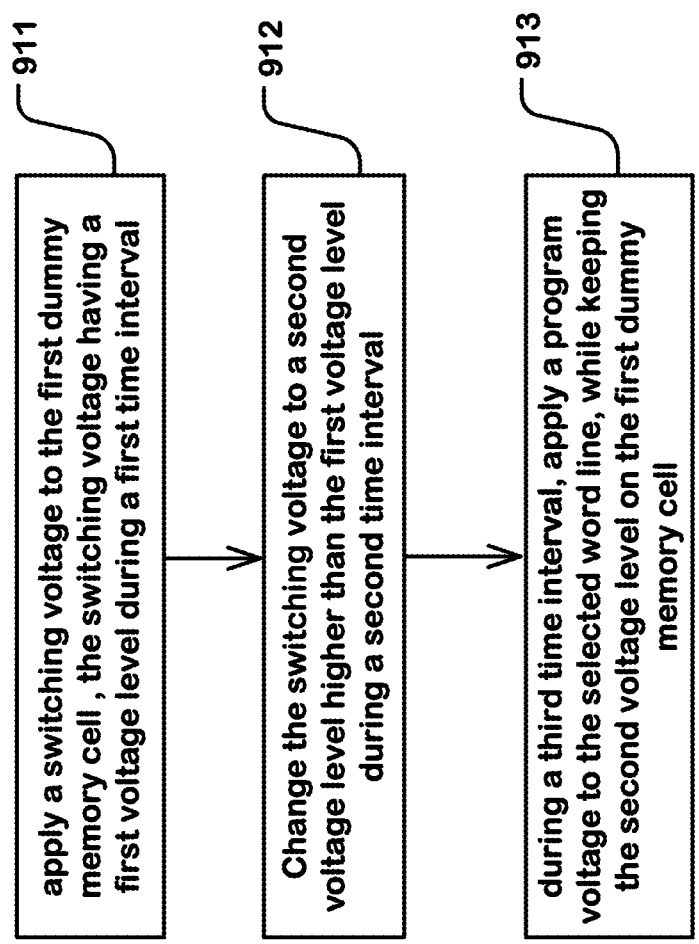
FIG. 9 is a simplified flowchart for programming a memory cell.

FIG. 9 is a simplified flowchart for programming a memory cell. At Step 911, a switching voltage is applied to the first dummy memory cell (e.g. DWL3), where the switching voltage has a first voltage level (e.g. Vdwl-pre) during a first time interval. At Step 912, the switching voltage is changed to a second voltage level (e.g. Vdwl) higher than the first voltage level during a second time interval. At Step 913, a program voltage (e.g. Vpgm) is applied to the selected word line, while the second voltage level is kept on the first dummy memory cell, during a third time interval.

A two-step waveform applied to the first dummy memory cell, including the first voltage level during the first time interval lower than the second voltage level during the second time interval, can diminish the boosted potential of the first dummy memory cell during the first time interval, reduce the disturbance on the first dummy memory cell, and weaken the associated hot carrier effect, as further described in reference to FIG. 6.

The two-step waveform can also alleviate the erased state disturbance of an edge memory cell adjacent the first dummy memory cell, because the boosting efficiency of the edge memory cell is enhanced via the rise of the bias on the first dummy memory cell from the first voltage level (e.g. Vdwl-pre) to the second voltage level (e.g. Vdwl) in the second time interval, as further described in reference to FIGS. 7D and 8.

The first time interval (e.g. bit line pre-charge time interval), second time interval (e.g. word line setup time interval), and third time interval (e.g. program time interval) are further described in reference to FIG. 4. During the first time interval, the bit line coupled to the channel line is pre-charged. When the bit line is pre-charged and a memory cell in the plurality of memory cells is at a high threshold voltage blocking a pre-charge current through the channel line, a transition of the switching voltage to the first voltage level during the first time interval can cause a boosted potential in a part of the channel line beneath the first dummy memory cell.

During the first time interval, a pass voltage level is applied to the second and third dummy memory cells (e.g. DWL1, DWL2). The pass voltage level is high enough to turn on the channel at the second and third dummy memory cells during the first time interval to pre-charge the bit line coupled to the channel line. The pass voltage level can be at a same voltage level as the second voltage level (e.g. Vdwl). During the second and third time intervals, the pass voltage level is kept on the second and third dummy memory cells.

During the first time interval, a blocking voltage (e.g. 0V) is applied to the selected word line corresponding to the selected memory cell, and to unselected word lines corresponding to unselected memory cells in the plurality of memory cells, where the blocking voltage can be lower than the first voltage level. During the second time interval, a pass voltage (e.g. Vpassp) is applied to the unselected word lines and the selected word line, where the pass voltage is lower than the program voltage. During the third time interval, the pass voltage (e.g. Vpassp) is kept on the unselected word lines.

In an embodiment, the first voltage level (e.g. Vdwl-pre) and the second voltage level (e.g. Vdwl) of the switching voltage applied to the first dummy memory cell can be 2V and 6V respectively. The program voltage (e.g. Vpgm) applied to the selected word line can be 20V, and the pass voltage (e.g. Vpassp) can be 10V.

Figure 10:
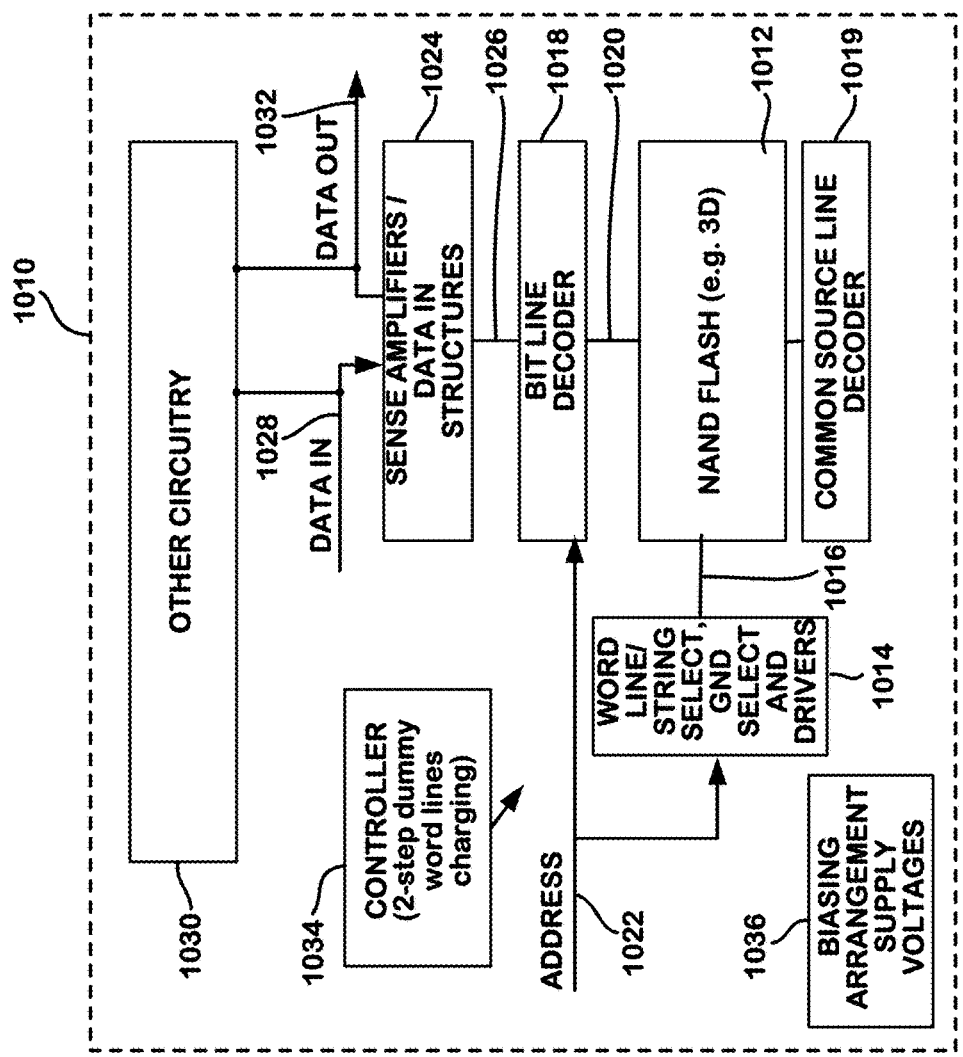
FIG. 10 is a block diagram of an integrated circuit memory employing memory cells and bias circuitry according to embodiments of the present technology.

FIG. 10 is a simplified block diagram of an integrated circuit employing NAND flash as described herein. The integrated circuit 1010 includes a memory array 1012 implemented using charge trapping memory cells or floating gate memory cells, for example, on a semiconductor substrate. A word line (or row), ground select and string select decoder 1014 (including appropriate drivers) are coupled to, and in electrical communication with, a plurality 1016 of word lines, string select lines and ground select lines, arranged along rows in the memory array 1012. A bit line (column) decoder and drivers 1018 are coupled to and in electrical communication with a plurality of bit lines 1020 arranged along columns in the memory array 1012 for reading data from, and writing data to, the memory cells in the memory array 1012. Optionally, a common source line decoder 1019 is provided to support shared word line and shared bit line arrangements, such as can occur in 3D memory architectures. Addresses are supplied on bus 1022 to the word line decoder and string select decoder 1014 and to the bit line decoder 1018. Sense amplifiers and data-in structures in block 1024, including current sources for the read, program and erase modes, are coupled to the bit line decoder 1018 via data bus 1026. Data is supplied via the data-in line 1028 from input/output ports on the integrated circuit 1010 or from other data sources internal or external to the integrated circuit 1010, to the data-in structures in block 1024. In the illustrated embodiment, other circuitry 1030 is included on the integrated circuit 1010, such as a general purpose processor or special purpose application circuitry, or a combination of modules providing system-on-a-chip functionality supported by the memory cell array. Data is supplied via the data-out line 1032 from the sense amplifiers in block 1024 to input/output ports on the integrated circuit 1010, or to other data destinations internal or external to the integrated circuit 1010.

A controller 1034 implemented in this example, using a bias arrangement state machine, controls the application of bias arrangement supply voltages and current sources 1036, such as read, program, erase, erase verify, program verify voltages or currents for the word lines and bit lines, and controls the word line/source line operation using an access control process. The controller 1034 can be implemented using special purpose logic circuitry as known in the art. In alternative embodiments, the controller 1034 comprises a general purpose processor, which may be implemented on the same integrated circuit, which executes a computer program to control the operations of the device. In yet other embodiments, a combination of special-purpose logic circuitry and a general-purpose processor may be utilized for implementation of the controller 1034. The controller 1034 can be configured to implement a method for programming a selected memory cell in a plurality of memory cells arranged in series (e.g. a NAND string in a NAND array), using a two-step waveform applied to the first dummy memory cell as described herein, comprising:

applying a switching voltage to the first dummy memory cell, the switching voltage having a first voltage level during a first time interval, and thereafter changing to a second voltage level higher than the first voltage level; and during a third time interval, applying a program voltage to the selected word line, while keeping the second voltage level on the first dummy memory cell.

The present technology is described herein using examples where first and second dummy memory cells are arranged in series between a first string select switch (e.g. GSL, FIG. 3) and a first edge memory cell (e.g. WL(0), FIG. 3) at a first end of the plurality of memory cells, where the first dummy memory cell (e.g. DWL3, FIG. 3) is adjacent the first edge memory cell (e.g. WL(0), FIG. 3), and the second dummy memory cell (e.g. DWL1, FIG. 3) is adjacent the first string select switch (e.g. GSL, FIG. 3).

Alternatively, in accordance with the present technology, first and second dummy memory cells can also be arranged in series between a second string select switch (e.g. SSL, FIG. 3) and a second edge memory cell (e.g. WL(N−1), FIG. 3) at a second end of the plurality of memory cells, where the first dummy memory cell is adjacent the second edge memory cell (e.g. WL(N−1), FIG. 3), and the second dummy memory cell is adjacent the second string select switch (e.g. SSL, FIG. 3).

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. A memory comprising:
    a plurality of memory cells arranged in series in a semiconductor body;
    a first string select switch between a reference line and a first end of the plurality of memory cells, and a second string select switch between a bit line and a second end of the plurality of memory cells;
    first and second dummy memory cells arranged in series between the first string select switch and a first edge memory cell at the first end or between the second string select switch and a second edge memory cell at the second end, the first dummy memory cell being adjacent one of the first and second edge memory cells, the second dummy memory cell being adjacent one of the first and second string select switches;
    a channel line including channels for the memory cells in the plurality of memory cells and the first and second dummy memory cells;
    a plurality of word lines, word lines in the plurality coupled to corresponding memory cells in the plurality of memory cells; and
    control circuitry coupled to the plurality of word lines and the first and second dummy memory cells adapted for programming a selected memory cell in the plurality of memory cells corresponding to a selected word line by:
        applying a switching voltage to the first dummy memory cell, the switching voltage stepping up to a first voltage level during a first time interval, and thereafter changing to a second voltage level higher than the first voltage level during a second time interval; and
        during a third time interval, applying a program voltage to the selected word line, while keeping the second voltage level on the first dummy memory cell.

2. The memory of claim 1, comprising:
    during the first time interval, pre-charging the bit line coupled to the channel line.

3. The memory of claim 2, when the bit line is pre-charged and a memory cell in the plurality of memory cells is at a high threshold voltage blocking a pre-charge current through the channel line, a transition of the switching voltage to the first voltage level during the first time interval causes a boosted potential in a part of the channel line beneath the first dummy memory cell.

4. The memory of claim 1, comprising:
    during the first time interval, applying a pass voltage level to the second dummy memory cell; and
    during the second and third time intervals, keeping the pass voltage level on the second dummy memory cell.

5. The memory of claim 1, comprising:
    during the first time interval, applying a blocking voltage lower than the first voltage level to the selected word line.

6. The memory of claim 1, comprising:
    during the first time interval, applying a blocking voltage to unselected word lines corresponding to unselected memory cells in the plurality of memory cells;
    during the second time interval, applying a pass voltage to the unselected word lines and the selected word line, the pass voltage being lower than the program voltage; and
    during the third time interval, keeping the pass voltage on the unselected word lines.

7. The memory of claim 1, comprising a continuous charge trapping structure between the channel line and dummy word lines corresponding to the first and second dummy memory cells.

8. The memory of claim 1, comprising:
    a third dummy memory cell arranged in series between the first and second dummy memory cells; and
    the control circuitry coupled to the third dummy memory cell and further adapted for programming the selected memory cell by:
        during the first time interval, applying a pass voltage level to the third dummy memory cell; and
        during the second and third time intervals, keeping the pass voltage level on the third dummy memory cell.

9. The memory of claim 8, the channel line including a channel for the third dummy memory cell.

10. A method for programming a selected memory cell in a plurality of memory cells arranged in series in a memory device, the memory device including:
    a first string select switch between a reference line and a first end of the plurality of memory cells, and a second string select switch between a bit line and a second end of the plurality of memory cells;

first and second dummy memory cells arranged in series between the first string select switch and a first edge memory cell at the first end or between the second string select switch and a second edge memory cell at the second end, the first dummy memory cell being adjacent one of the first and second edge memory cells, the second dummy memory cell being adjacent one of the first and second string select switches; and a channel line including channels for the memory cells in the plurality of memory cells and the first and second dummy memory cells, the method comprising:

applying a switching voltage to the first dummy memory cell, the switching voltage stepping up to a first voltage level during a first time interval, and thereafter changing to a second voltage level higher than the first voltage level; and during a third time interval, applying a program voltage to a selected word line corresponding to the selected memory cell, while keeping the second voltage level on the first dummy memory cell.

11. The method of claim 10, comprising:
during the first time interval, pre-charging the bit line coupled to the channel line.

12. The method of claim 11, when the bit line is pre-charged and a memory cell in the plurality of memory cells is at a high threshold voltage blocking a pre-charge current through the channel line, a transition of the switching voltage to the first voltage level during the first time interval causes a boosted potential in a part of the channel line beneath the first dummy memory cell.

13. The method of claim 10, comprising:
during the first time interval, applying a pass voltage level to the second dummy memory cell; and
during the second and third time intervals, keeping the pass voltage level on the second dummy memory cell.

14. The method of claim 10, comprising:
during the first time interval, applying a blocking voltage lower than the first voltage level to the selected word line.

15. The method of claim 10, comprising:
during the first time interval, applying a blocking voltage to unselected word lines corresponding to unselected memory cells in the plurality of memory cells;
during the second time interval, applying a pass voltage to the unselected word lines and the selected word line, the pass voltage being lower than the program voltage; and
during the third time interval, keeping the pass voltage on the unselected word lines.

16. The method of claim 10, the memory device including a third dummy memory cell arranged in series between the first and second dummy memory cells, the method comprising:
during the first time interval, applying a pass voltage level to the third dummy memory cell; and
during the second and third time intervals, keeping the pass voltage level on the third dummy memory cell.

* * * * *